United States Patent [19]

Brewer et al.

[11] Patent Number: 4,876,165

[45] Date of Patent: Oct. 24, 1989

[54] LIGHT FILTERS FOR MICROELECTRONICS

[75] Inventors: Terry L. Brewer, Rolla; Dan W. Hawley, St. James; James E. Lamb; William J. Latham, both of Rolla; Lynn K. Stichnote, Cuba, all of Mo.

[73] Assignee: Brewer Science, Inc., Rolla, Mo.

[21] Appl. No.: 2,107

[22] Filed: Jan. 12, 1987

Related U.S. Application Data

[63] Continuation-in-part of Ser. No. 431,798, Sep. 30, 1982, abandoned, which is a continuation-in-part of Ser. No. 638,258, Aug. 6, 1984, which is a continuation-in-part of Ser. No. 825,855, Feb. 4, 1986, Pat. No. 4,822,718.

[51] Int. Cl.$^4$ ................................................ G03F 7/26
[52] U.S. Cl. .......................................... 430/7; 430/20; 430/330; 350/311; 350/330

[58] Field of Search ...................... 430/7, 321, 283, 20, 430/4, 330; 350/311, 330

[56] References Cited

U.S. PATENT DOCUMENTS 4,668,606  5/1987  Do Minh et al. .................. 430/271

FOREIGN PATENT DOCUMENTS 58-100108  6/1983  Japan ........................................ 430/7
237403  11/1985  Japan ................................... 350/311

Primary Examiner—José G. Dees
Attorney, Agent, or Firm—Cohn, Powell & Hind

[57] ABSTRACT

Filters suitable for microelectronic uses and the like may be prepared directly on substrates either as monolithically integrated filters or as hybrid filters using a soluble dye material in a resin. The resin may be applied to microelectronic substrates and patterned by conventional microphotolithographic processes.

15 Claims, 1 Drawing Sheet

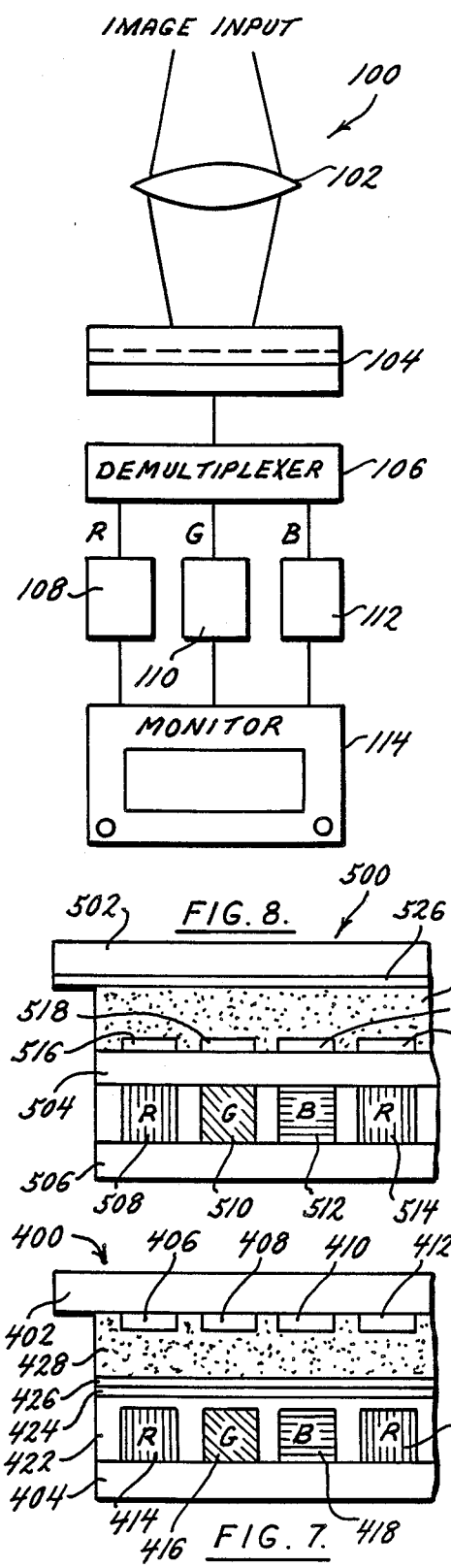
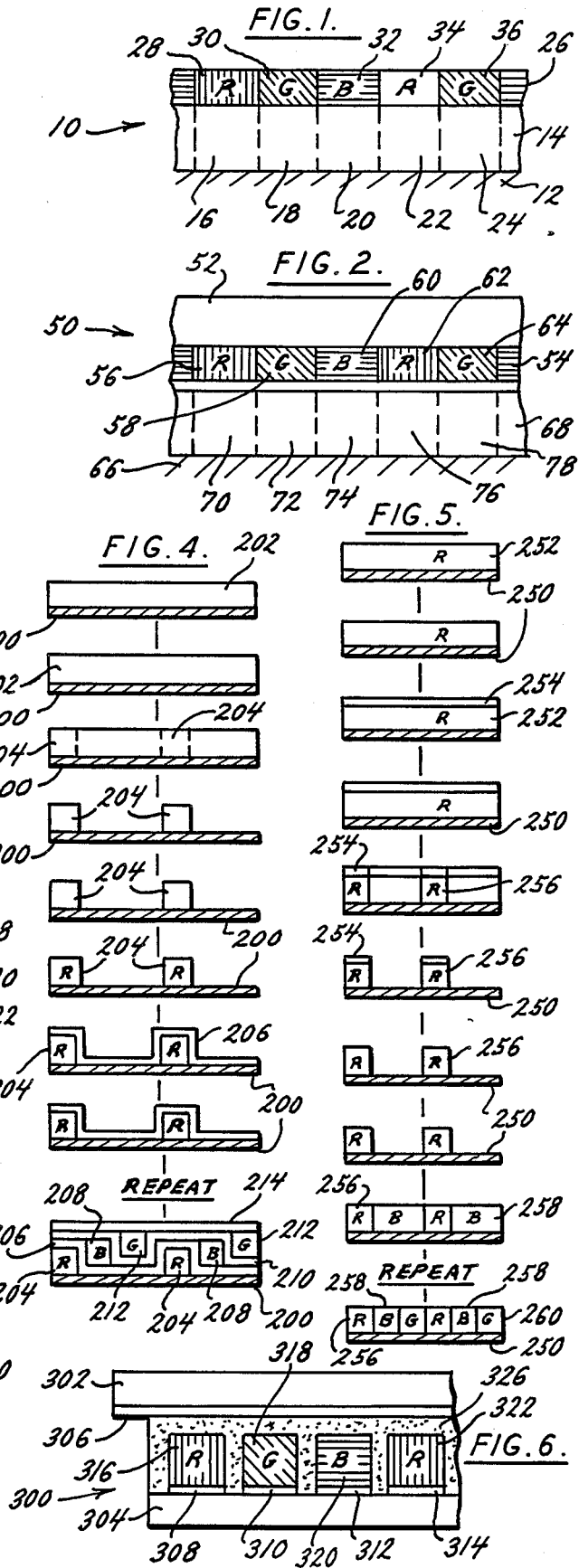

LIGHT FILTERS FOR MICROELECTRONICS

BACKGROUND AND SUMMARY OF THE INVENTION

This is a continuation-in-part of U.S. patent application Ser. No. 431,798, abandoned, filed Sept. 30, 1982; U.S. patent applicaton Ser. No. 638,258 filed Aug. 6, 1984; and U.S. patent application Ser. No. 825,855, U.S. Pat. No. 4,822,718 filed Feb. 4, 1986. Applicants are aware of the following U.S. Pat. Nos. 4,315,978 and 4,355,087. The disclosures of these patents and applications are incorporated by reference herein.

In recent years many electronic devices have been developed which emit or in someway modulate light, or which sense or emit light of particular spectra. In the microelectronics industry in particular, videocameras, flat panel displays and other devices require the ability to sense or emit colored light. This is typically accomplished by incorporating filters into the device, either directly as a monolithically integrated structure or by "hybrid" technology. A typical technique for producing conventional filters is described in U.S. Pat. No. 4,315,978. These filters require a multi-step process using protective layers between the elements of the filter. As a result, the different color elements of the filter are on separate levels. The use of color filters in videocameras and similar devices is described in "Heat-and-Integrated Color Filters," N. Kioke et al., and "Color Filters and processing Alternatives For One-Chip Cameras," K. Parulski, *IEEE Transactions on Electron Devices*, vol. Ed-32, no. 8, August 1985, the disclosures of which are incorporated by reference herein.

Applicants have developed a process of producing color filters which places all of the filter elements on the same level. No protective or planarizing layers are required. Applicants' process uses a polymer and dye combination having a dye which is at least partially soluble in the polymer. The polymer and dye solution is applied as a thin film which has excellent film integrity. The film is continuous and uniform and has excellent mechanical, chemical and electronic properties compatable with the requirements of electronic devices. For example, applicants' polymer and dye may be consistently applied at thicknesses as low as about 0.1 micron and up to 25 microns or more. The polymer and dye have high color resolution in the specific wave length range chosen. The colors can be red, green, blue or other conventional colors such as yellow, cyan, magenta. The filters formed by applicants' material may be applied in arrays, for example in stripe or checkerboard arrays to form color pixels, for videocameras and video displays and the like. In addition, the applicants' material may be used to form single color filters, for example, for photographic purposes. The filters formed may be for any particular light spectra, both in visible and invisible wave lengths, such as infra red and ultra violet wave lengths.

Applicants' invention preferably uses a polymer precursor, such as a polyamic acid, or other polymers, such as PMMA, and soluble dyes which form a uniform coating with extremely good insulating properties, good adhesion properties, wet and dry development characteristics with a conventional photoresist system and a very high light transmission in the desired wavelengths, for example to create the colors red, blue and green, and very high rejection of light at wavelengths not desired. Applicants' coating material has a film thickness compatible with electronic and electrical devices and has a very high resolution of features compatible with such electrical and electronic devices. Elements as small as eight microns or less can be patterned. The light absorbing film demonstrates extremely good thermal, chemical, and aging stability and may remain an integral part of an electrical or electronic device. For example, applicants' filters will remain stable and provide consistent color transmission, in a videocamera for example, over a lifetime of service. The excellent chemical resistance is especially useful in hostile or corrosive environments, including low pressure and low gravity, as encountered in space exploration.

Applicants' material provides excellent adhesion to conventional substrates including glass, silicon, silicon dioxide, aluminum, silicon nitride and polymers, for example polyimides and photoresist. Applicants' material can be cured by conventional means, such as baking at elevated temperatures, or with the appropriate polymers can be cured by radiation, such as microwave, UV, or IR or can be chemically cured. Applicants' material is compatable with conventional resist systems, substrates and adhesion promoters. The cured system has excellent optical clarity. The resin and dye system is highly compatable and the cured material has a very low (or very slow) solubility. No intermediate or protective layers are required when placing plural filters in a filter array. The colors of adjacent filter elements may be overlapped for greater contrast, if desired. Color control and reproducibility is excellent. The dye is incorporated into the vehicle prior to application of the vehicle to the substrate so that no inconsistent color absorption is encountered. The electrical properties of applicants' material are also superior; the material has very high resistivity and high dielectric strength.

DESCRIPTION OF THE DRAWINGS

FIG. 1 is a schematic view of a monolithically integrated color filter and sensor for a videocamera and the like using applicants' process and material;

FIG. 2 is a schematic view of a hybrid color filter and sensor for a videocamera and the like using applicants' process and material;

FIG. 3 is a schematic view of a videocamera and monitor incorporating a color filter and sensor, as shown in FIGS. 1 and 2;

FIG. 4 is a flow diagram for a conventional process of producing color filters;

FIG. 5 is a flow diagram for applicants' process of producing color filters;

FIG. 6 is a schematic view of a liquid crystal flat panel display using applicants' monolithically integrated filter;

FIG. 7 is an alternative flat panel display using a hybrid filter construction, and FIG. 8 is a further alternative flat panel display.

DESCRIPTION OF THE PREFERRED EMBODIMENTS

Applicants' coating material has a very broad application. For example, it may be used to replace state of the art "hybrid" filters and monolithically integrated filters. It may be used to make "hybrid" filters and it may be used to integrate filters directly into electronic devices. For example, applicants' filters may be used to make color videocameras and flat panel displays for television and the like, and photographic filters of very high resolution and color transmission.

Applicants' material includes a polymer or a polymer precursor and soluble dyes that are effective to form a uniform, thin, tightly bonded continuous film with good insulating properties, good adhesion properties and wet and/or dry etch development properties with photoresist systems. Applicants' filters have high color resolution in the desired wavelength range or ranges, for example, the primary colors red, green and blue. Other colors may be used if desired. The film thickness is compatible with electrical and electronic devices and the coating has high resolution required by electrical and electronic devices, such as microelectronic devices. The light transmitting film also demonstrates good thermal, chemical and aging stability necessary to remain an integral part of an electrical system.

The coating material is a solution containing a vehicle, such as a polyimide or polyimide precursor and a solvent soluble dye or dyes. The material has very high resistivity and very high dielectric strength and does not interfere with performance of electrical or electronic devices on which it is coated. The material has no large particles, since it is a solution, and coatings are very uniform. Applicants' material adheres very well to silicon, silicon oxide, aluminum and other conventional substrates.

Applicants' product may be used and applied in a conventional manner. The material may be spun or sprayed on any conventional microelectronic substrate. For example, spinning at 5000 rpm will typically give a film which is 1.5 microns thick. The material may be baked to remove solvent and to crosslink the polymer precursor. If the product is to be wet etched, a positive photoresist may be spun on top. The resist is baked, exposed and developed as is conventional in the art. Applicants' coating layer may develop out where the photoresist is removed and so may be patterned at the same time as the photoresist. If the material is to be dry etched a layer of aluminum or other suitable etch mask may be deposited on top of the coating layer and patterned. The substrate is then placed in a chamber for a reactive ion or plasma etching and the coating layer is etched out in areas not covered by the etch mask. After patterning the light absorbing layer may be baked at a higher temperature to harden the polymer.

The coating and patterning steps may be repeated to place multiple color elements on the same substrate. For example, the process may be performed to place a first set of spaced elements or pixels of a given color (red) on the substrate, repeated to place a second set of a different color (blue) on the substrate and repeated again to place a third set of another color (green) on the substrate. This process is shown schematically in FIG. 5. The number and proportions of the colors in the array may be varied, as desired. It is conventional to use twice the number of green pixels as red and blue for some applications, such as video.

As shown in FIG. 1, a monolithically integrated filter 10 may be prepared on a microelectronic substrate 12, as shown. The substrate 12 may have an electrode layer 14 thereon which may be made up of individually addressable electrodes 16, 18, 20, 22 and 24, as is known in the art. A filter layer 26 is deposited and patterned directly on the electrodes in a planar layer, as described herein. The filter layer may have individual color elements, for example red, green and blue, 28, 30, 32, 34 and 36, as shown on the electrodes.

As shown in FIG. 2, a "hybrid" filter 50 is prepared using a glass substrate 52. Glass substrate 52 may have a planar array 54 of filters, for example red, green and blue, made up of individual color elements 56, 58, 60, 62 and 64, as shown. The filter elements are deposited and patterned on the glass substrate 52 as described herein. The glass substrate 52 having filter array 54 thereon is then placed on a microelectronic substrate 66 having an electrode layer 68 thereon, as shown. The electrode layer may have individually addressable electrodes 70, 72, 74, 76 and 78. The glass substrate 52 may be placed on microelectronic substrate 66 so that individual filter elements 56, 58, 60, 62 and 64 are in register with electrodes 70, 72, 74, 76 and 78, as is known in the art.

Applicants' filters, such as filter 10 or filter 50, may be incorporated into a videocamera 100, as shown in FIG. 3. The videocamera 100 may have a conventional lens 102 and a filter 104, which may be a filter such as either filter 10 or filter 50 previously described. The output from filter 104 is fed through a multiplexer 106 and then through gamma correction 108, 110 and 112. The output signal may then be fed to a monitor 114. It will be appreciated that the signal may also be recorded on conventional tape or other medium, e.g., in digitized form.

In the conventional gelatin process, as shown in FIG. 4, a substrate 200 is coated with a gelatin resist 202. The substrate 200 and resist 202 coated thereon are prebaked to set the gelatin resist 202. The resist 202 is exposed to the influence of light and a pattern, to pattern the gelatin resist layer 202. The gelatin layer 202 is then developed to form gelatin structures 204 on the substrate 200. The gelatin structures 204 are then baked a second time and subjected to a dye solution, for example red, which impregnates the gelatin structures 204. The dyed gelatin structurs 204 are then coated with a protective layer 206 and the protective layer 206 is then cured to render it insoluble. The process is then repeated, for example a second and then a third time, to prepare a final filter on substrate 200 having red dyed gelatin structures 204 covered by a protective layer 206, blue dyed gelatin structures 208 on protective layer 206 covered by a subsequent protective layer 210 and green dyed gelatin structures 212 on protective layer 210. The green structures 212 are coated with an overall protective layer 214, which protects and planarizes the entire structure.

In contrast, as shown in FIG. 5, applicants prepare a monolithic filter on a substrate 250 by coating a vehicle 252 such as a polyamic acid (polyimide precursor) on substrate 250. The vehicle 252 contains the soluble filter dye as described herein. The substrate 250 and vehicle 252 are then prebaked to insolublize the resin 252 and a photoresist 254 is then coated over the resin 252 and given a second prebaking. The photoresist 254 is then exposed to pattern the photoresist 254 and resin layer 252 underneath and developed to form the structure 256, for example red color elements, on the substrate 250. The photoresist 254 is then removed to expose color elements 256 on substrate 250 and the color filter elements 256 are then baked to further insolublize the filter elements 256. The process may then be repeated, for example a second and then a third time, to form an array on substrate 250 having separate color elements, for example red 256, blue 258 and green 260, as shown. As can be seen in FIG. 5 the array of filter elements is a substantially planar array and does not require any separating or covering protective layers. The array thus can provide maximal optical characteristics. That is, the scattering or bending of light through the filter is at a minimum due to the filter's planar construction.

Depending upon the method and the application, the light absorbing layer may be a few microns to a few tenths of microns in thickness. Spinning typically yields films from one micron to ten microns in thickness. Conventional spraying produces films which may be as thick as twenty-five microns. Applicants' product is unique in that very small geometries can be patterned in it. Wet processing of a two micron thick film for example can resolve lines as small as five microns. Dry etch processing can resolve lines smaller than one micron.

Applicants' coating becomes substantially insoluble in conventional solvents, once the film has been baked. Consequently, plural application of color elements does not require the use of intermediate protective or planarizing layers between applications of each color of filter elements in an array. Moreover, the dyes are incorporated in the coatings prior to the application of the coating to the substrate. The application of the coating with the dye incorporated eliminates the steps of dyeing the elements after the coatings have been applied. Unlike gelatin color filters, dyes are contained in the applicants' filter when it is deposited. This permits far better control over the spectral characteristics of the filters. In the process of dyeing gelatin, many variables limit reproducibility. These include dye concentration, pH, and temperature of the dye bath, as well as the length of time the gelatin is immersed in the bath. Also, the nature and thickness of gelatin are important variables. Gelatin (fish glue) is a poorly characterized material, the physical and chemical properties of which may vary widely.

The resistivity of the coatings is typically $3 \times 10^{15}$ ohm-cm or more and the dielectric strength typically exceeds $7 \times 10^5$ volts per centimeters. These are outstanding electrical characteristics for an organic film and far better than conventional material.

The vehicle for applicants' filter layer may typically include a polyimide precursor which reacts in use to form a polyimide resin. The precursor typically includes a polyamic acid for example prepared by reacting oxydianiline (ODA) with pyromellitic dianhydride (PMDA) or prepared by reacting ODA with PMDA and benzophenone tetracarboxylic dianhydride (BTDA). Other equivalent polyimide acids and polyimide precursors may be used. The reactants for the polyimide precursors are typically included in approximately stoichiometric amounts. Some formulations may include at least some water soluble polymers and other additives, such as silanes, plasticizers, anti-oxidants, cross-linking agents and other conventional additives. Other polymers may also be used, including PMMA, 4-aminophenyl sulfone (4-APS), 3-aminophenyl sulfone (3-APS), bis (aminophenoxyphenyl sulfone) (BAPS), vinyl pyridine polymers, malic anhydride polymers and mixtures and copolymers thereof. The dyes may be chosen from soluble organic dyes which are effective to absorb the particular color desired. The primary colors red, blue and green are preferred for some applications. Other dye combinations, such as yellow, cyan and magenta may also be used.

Exemplary dyes are as follows, it being understood that the dyes may be combined to form colors other than the red, blue, green primary colors which are given for purposes of illustration and that other suitable dyes and dye combinations may also be used:

TABLE I

| Dye | Trade Name | Vendor |
| --- | --- | --- |
| DYES | | |
| Acid Violet 49 | Acid Violet 49 | Aakash Chemicals |
| Acid Blue 9 | Alphazurine FGND | Keystone Aniline |
| | Bromophenol Blue | Aldrich Chemical |
| | Bromothymol Blue | Aldrich Chemical |
| | 6-butoxy-2,6-diamino-3,3'-azodipyridine | Aldrich Chemical |
| Solvent Yellow 33 | Calco Chinoline Yellow | American Cyanamid |
| | Ceres Blue CV | Mobay Chemical |
| | Coumarin 504 | Exciton |
| Solvent Blue 35 | Hytherm Blue 200 | Morton Chemical |
| Solvent Green 3 | Hytherm Blue Green BF | Morton Chemical |
| Solvent Violet 13 | Hytherm Purple KIF | Morton Chemical |
| Solvent Orange 23 | Iosol Orange | Crompton & Knowles |
| Solvent Red 68 | Iosol Red | Crompton & Knowles |
| Solvent Yellow 42 | Iosol Yellow | Crompton & Knowles |
| Acid Violet 17 | Keyacid Violet 5BNS | Keystone Aniline |
| Solvent Violet 23 | Keyfast Spirit Violet BR | Keystone Aniline |
| | Keyplast Violet MR | Keystone Aniline |
| | Keyplast Violet 3R | Keystone Aniline |
| Solvent Orange 62 | Lampronol Orange R | ICI Americas |
| Solvent Red 8 | Lampronol Red 2BR | ICI Americas |
| | Lampronol Scarlet G | ICI Americas |
| Solvent Yellow 21 | Lampronol Yellow 2RN | ICI Americas |
| | Lampronol Yellow 3G | ICI Americas |
| Solvent Blue 37 | Luxol Fast Blue ARN | Aldrich Chemical |
| Solvent Blue 38 | Luxol Fast Blue MBSN | Aldrich Chemical |
| | Macrolex Blue RR | Mobay Chemical |
| | Methylene Violet | Aldrich Chemical |
| Solvent Violet 14 | Morton Violet 14 | Morton Chemical |
| Solvent Red 122 | Neopen Red 336 | BASF Wyandotte |
| Solvent Yellow 82 | Neopen Yellow 159 | BASF Wyandotte |
| Solvent Blue 70 | Neozapon Blue 807 | BASF Wyandotte |
| Solvent Orange 62 | Neozapon Orange 251 | BASF Wyandotte |
| Solvent Red 119 | Neozapon Red 355 | BASF Wyandotte |
| Solvent Red 122 | Neozapon Red 395 | BASF Wyandotte |
| Solvent Yellow 79 | Neozapon Yellow 081 | BASF Wyandotte |
| Solvent Blue 38 | Neptun Blue 722 | BASF Wyandotte |

TABLE I-continued

DYES

| Dye | Trade Name | Vendor |
|---|---|---|
| | Neramine REd SJ | ICI Americas |
| | 4-(4-nitrophenylazo)-1-naphthol | Aldrich Chemical |
| Solvent Blue 14 | Oil Blue N | Aldrich Chemical |
| Solvent Yellow 56 | Oil Yellow E-190 | Passaic Color & Chemical |
| Solvent Blue 49 | Orasol Blue BLN | Ciba Geigy |
| Solvent Blue 48 | Orasol Blue 2GLN | Ciba Geigy |
| Solvent Blue 67 | Orasol Blue GN | Ciba Geigy |
| Solvent Orange 11 | Orasol Orange G | Ciba Geigy |
| Solvent Orange 59 | Orasol Orange RLN | Ciba Geigy |
| Solvent Red 127 | Orasol Pink 5BLG | Ciba Geigy |
| Solvent Red 7 | Orasol Red B | Ciba Geigy |
| Solvent Red 125 | Orasol Red G | Ciba Geigy |
| Solvent Red 132 | Orasol Red 2BL | Ciba Geigy |
| Solvent Red 130 | Orasol Red 3GL | Ciba Geigy |
| Solvent Violet 24 | Orasol Violet RN | Ciba Geigy |
| Solvent Yellow 88 | Orasol Yellow 2GLN | Ciba Geigy |
| Solvent Yellow 89 | Orasol Yellow 2RLN | Ciba Geigy |
| Solvent Yellow 25 | Orasol Yellow 3R | Ciba Geigy |
| Solvent yellow 146 | Orasol Yellow 4GN | Ciba Geigy |
| Solvent Red 111 | Perox Red AAP | Morton Chemical |
| Solvent Red 46 | Perox Red 46 | Morton Chemical |
| Solvent Red 207 | Peros Red 61 | Morton Chemical |
| Solvent Yellow 163 | Perox yellow GS | Morton Chemical |
| | Pylakrome Bright Pink | Pylam Products |
| | Resolin yellow 5GL | Mobay Chemical |
| Solvent Blue 44 | Savinyl Blue GLS | Sandoz Chemical |
| Solvent Blue 45 | Savinyl Blue RLS | Sandoz Chemical |
| Solvent Red 90:1 | Savinyl Red BLSN | Sandoz Chemical |
| Solvent Red 91 | Savinyl Red 3BLS | Sandoz Chemical |
| Solvent Red 124 | Savinyl Fire Red 3GLS | Sandoz Chemical |
| Solvent Red 127 | Savinyl Pink 6BLS | Sandoz Chemical |
| Solvent Red 92 | Savinyl Scarlet RLS | Sandoz Chemical |
| Solvent Yellow 83 | Savinyl Yellow RLSN | Sandoz Chemical |
| Solvent Yellow 138 | Savinyl Yellow 5GLS | Sandoz Chemical |
| Solvent Blue 4 | Solvent Blue 4 | Aakash Chemical |
| Solvent Blue 5 | Solvent Blue 5 | Aakash Chemical |
| | Solvinac Golden Yellow | Chemical Clearing |
| Solvent Blue 25 | Sudan Blue 670 | BASF Wyandotte |
| | Sudan Yellow 146 | BASF Wyandotte |
| | Sudan Orange G | Aldrich Chemical |
| | Sulfanazo III | Aldrich Chemical |

Red Coatings

Red coatings may be prepared by dissolving a resin vehicle in a solvent, as described herein, with one or more of the following yellow dyes in combination with one or more of the following red dyes.

TABLE II

| Yellow Dyes | Red Dyes |
|---|---|
| Solvent Yellow 83 | Solvent Red 90 |
| Solvent Yellow 138 | Solvent Red 91 |
| Solvent Orange 23 | Solvent Red 68 |
| Solvent Yellow 42 | Solvent Red 8 |
| Solvent Orange 62 | Lampronol Scarlet G |
| Solvent Yellow 21 | Solvent Red 122 |
| Lampronol Yellow 3G | Solvent Red 119 |
| Solvent Yellow 82 | Solvent Red 127 |
| Solvent Orange 62 | Solvent Red 7 |
| Solvent Yellow 79 | Solvent Red 125 |
| Solvent Orange 11 | Solvent Red 132 |
| Solvent Orange 59 | Solvent Red 130 |
| Solvent Yellow 88 | Solvent Red 111 |
| Solvent Yellow 89 | Solvent Red 46 |
| Solvent Yellow 25 | Solvent Red 207 |
| Solvent Yellow 163 | Solvent Red 92 |
| Curcumin | Solvent Red 109 |
| Sudan Yellow 146 | Solvent Red 118 |
| Solvent Yellow 33 | Neramine Red SJ |
| Resolin Yellow 5GL | Pylakrome Bright Pink |
| Solvent Yellow 56 | Waxoline Rubine TRFW |
| Coumarin 504 | |
| 6'-butoxy-2,6-diamino-3,3'-azodipyridine | |
| Sudan Orange G | |
| Solvinac Golden Yellow | |

Green Coatings

Green coatings may be prepared by dissolving a resin vehicle in a solvent, as described herein, with one or more of the following yellow dyes in combination with one or more of the following blue dyes:

TABLE III

| Yellow Dyes | Blue Dyes |
|---|---|
| Solvent Yellow 83 | Solvent Green 3 |
| Solvent Yellow 138 | Solvent Blue 38 |
| Solvent Yellow 42 | Solvent Blue 70 |
| Solvent Yellow 21 | Solvent Blue 38 |
| Lampronol Yellow 3G | Solvent Blue 48 |
| Solvent Yellow 82 | Solvent Blue 67 |
| Solvent Yellow 79 | Solvent Blue 44 |
| Solvent Yellow 88 | Solvent Blue 25 |
| Solvent Yellow 89 | |
| Solvent Yellow 25 | |
| Solvent Yellow 146 | |
| Solvent Yellow 163 | |
| Solvent Yellow 21 | |

Blue Coatings

Blue coatings may be prepared by dissolving a resin vehicle in a solvent, as described herein, with one or more of the following blue dyes:

TABLE IV

| Blue Dyes |
| --- |
| Solvent Blue 35 |
| Solvent Violet 13 |
| Solvent Blue 37 |
| Solvent Blue 38 |
| Solvent Violet 14 |
| Solvent Blue 70 |
| Solvent Blue 14 |
| Solvent Blue 49 |
| Solvent Blue 48 |
| Solvent Blue 67 |
| Solvent Violet 24 |
| Solvent Blue 44 |
| Solvent Blue 45 |
| Solvent Blue 35 |
| Solvent Blue 25 |
| Solvent Red 127 |
| Solvent Blue 4 |
| Keyplast Violet MR |
| Methylene Violet |
| Keyplast Violet 3R |
| Solvent Violet 23 |
| Acid Violet 49 |
| Acid Violet 17 |
| Solvent Blue 5 |
| Macrolex Blue RR |
| Bromothymol Blue |
| Sulfanazo III |
| Ceres Blue ZV |
| 4-(4-nitrophenylazo)-1-naphthol |

The dyes and vehicle or vehicle precursor are included with a solvent system so that the entire system is cosoluble. A typical solvent would include cyclohexanone, NMP (N-methyl pyrrolidone), cellosolves, ethers, chlorobenzene, glycols, ketones, water and similar solvents which are effective to cosolubilize the resin and dye.

The invention will be further understood by reference to applicants' examples included herein.

EXAMPLE 1:

A blue filter coating was prepared using the following coating formulation:
Solvent Blue 49: 6%
Solvent Blue 38: 2%
Polyamic acid (BTDA/4-APS): 14%
NMP: 32%
2-methoxyethyl ether: 46%

The coating was placed in solution by stirring the mix for several hours. The mix was then filtered to remove any undissolved material. The coating solution was then dispensed onto a glass substrate and onto a silicon substrate having a layer of grown silicon dioxide. The substrates were then spun at 5000 rpm for 90 seconds to produce a film having a thickness of 1.6 microns. The film was baked at 195° C. for 90 seconds on a hotplate. The baked film on each substrate was coated with AZ-1470(TM) photoresist (Shipley Corp.). The photoresist was spun at 5000 rpm for 30 seconds and then baked for 30 minutes in a convection oven at 90° C. The resist was patterned using a stripe color filter mask and exposed to UV light in a contact printer. The exposed photoresist on each substrate was developed by immersion for 20 seconds in MF-312(TM) developer (Shipley Corp.) diluted 1:1 with water. The developing step transferred the pattern to the photoresist and to the dyed film. The patterned substrates were then baked at 110° C. for 30 seconds to remove water from the films and the photoresist was removed from the dyed film by immersion for 20 seconds in propylene glycol monomethyl ether acetate. The substrates were then given a cure by baking at 250° C. for one hour in a convection oven. The cured substrates each had blue striped pixels on their surfaces capable of transmitting light between about 400–525 nanometers.

EXAMPLE 2:

The substrates of Example 1 were coated with a green filter coating using the following formulation:
Solvent Yellow 82: 8%
Solvent Blue 44: 4%
Solvent Blue 38: 4%
Polyamic acid (PMDA/ODA): 16%
NMP: 38%
2-methoxyethyl ether: 30%

The procedure followed was the same as that described for Example 1, except the first hotplate bake was at 164° C. and the final cure was at 230° C. The cured substrates each had striped blue and green pixels. The green pixels were capable of transmitting light at between about 500–600 nanometers.

EXAMPLE 3:

The substrates of Example 2 were coated with a red filter coating using the following formulation:
Solvent Red 132: 6%
Solvent Yellow 89: 7%
Polyamic acid (PMDA/ODA): 17%
NMP: 40%
2-methoxymethyl ether: 30%

The procedure followed was the same as that described for Example 1, except the first hotplate bake was at 172° C. and the final cure was at 230° C. The cured substrates each had striped red, blue and green pixels. The red pixels were capable of transmitting light at between about 570–700 nanometers. The completed filters were suitable for numerous uses, such as electronic, microelectronic, optical and the like. The patterned array of each substrate was directly coated without any intermediate, planarizing or protective layers. The filter arrays were substantially planar, with no "stair step" arrangement of the pixels. The filter prepared on the glass substrate is suitable for use as a "hybrid" filter for liquid crystal displays and the like. The filters had excellent optical transmission, solvent resistance and dimensional properties. The filter coating is about 1.6 microns in thickness and is chemically, thermally and optically stable. The filter prepared on a silicon/silicon dioxide substrate is suitable for an optical filter for a one chip videocamera (using the chip as the substrate).

Coatings have been prepared using the procedures outline in Examples 1–3 from the following formulations:

EXAMPLE 4: Red

Solvent Red 132: 6%
Solvent Yellow 82: 7%
Polyamic acid (BTDA/4-APS): 17%
NMP: 40%
2-methoxyethyl ether: 30%

EXAMPLE 5: Red

Solvent Red 92: 10%
Curcumin: 3%
Solvent Red 127: 1%
Polyamic acid (PMDA/ODA): 10%
NMP: 36%
Cyclohexanone: 40%

EXAMPLE 6: Red

Solvent Red 132: 10%
Polyamic acid (BTDA/4-APS): 18%
NMP: 40%
2-methoxyethyl ether: 32%

EXAMPLE 7: Green

Solvent Yellow 146: 8%
Solvent Blue 38: 10%
Polyamic acid (BTDA/4-APS): 16%
NMP: 37%
2-methoxyethyl ether: 29%

EXAMPLE 8: Green

Solvent Yellow 146: 9%
Solvent Blue 44: 9%
Polyamic acid (BTDA/4-APS): 16%
NMP: 37%
2-methoxyethyl ether: 29%

EXAMPLE 9: Green

Solvent Yellow 82: 8%
Solvent Blue 38: 10%
Polyamic acid (PMDA-ODA): 16%
NMP: 37%
Cyclohexanone: 29%

EXAMPLE 10: Green

Solvent Yellow 79: 9%
Solvent Blue 44: 9%
Polyamic acid (BTDA/4-APS): 16%
NMP: 37%
Cyclohexanone: 29%

EXAMPLE 11: Blue

Solvent Blue 49: 6%
Solvent Blue 44: 2%
Polyamic acid (BTDA/4-APS): 14%
NMP: 32%
Cyclohexanone: 46%

EXAMPLE 12: Blue

Solvent Blue 45: 15%
Solvent Blue 44: 2%
Polyamic acid (PMDA/ODA): 13%
NMP: 29%
Cyclohexanone: 41%

EXAMPLE 13: Blue

Solvent Violet 24: 6%
Solvent Blue 44: 2%
Polyamic acid (BTDA/4-APS): 14%
NMP: 32%
2-methoxyethyl ether: 46%

EXAMPLE 14: Blue

Solvent Violet 13: 6%
Solvent Blue 38: 2%
Polyamic acid (BTDA/4-APS): 14%
NMP: 32%
2-methoxyethyl ether: 46%

EXAMPLE 15: Yellow

Solvent Yellow 146: 10%
Polyamic acid (BTDA/ODA): 15%
NMP: 28%
2-methoxyethyl ether: 47%

EXAMPLE 16: Yellow

Solvent Yellow 42: 12%
Polyamic acid (PMDA/ODA): 18%
NMP: 30%
Cyclohexanone: 40%

EXAMPLE 17: Yellow

Solvent Yellow 82: 10%
Polyamic acid (PMDA/ODA): 15%
NMP: 28%
Cyclohexanone: 47%

EXAMPLE 18: Yellow

Solvent Yellow 79: 7%
Solvent Yellow 88: 7%
Polyamic acid (4-APS/BTDA): 18%
NMP: 28%
Cyclohexanone: 40%

EXAMPLE 19: Magenta

Solvent Violet 14: 10%
Polyamic acid (4-APS/BTDA): 15%
NMP: 35%
2-methoxyethyl ether: 40%

EXAMPLE 20: Magenta

Solvent Violet 13: 10%
Polyamic acid (PMDA/ODA): 15%
NMP: 35%
Cyclohexanone: 40%

EXAMPLE 21: Magenta

Solvent Violet 24: 15%
Polyamic acid (4-APS/BTDA): 16%
NMP: 35%
Cyclohexanone: 34%

EXAMPLE 22: Magenta

Solvent Red 127: 8%
Solvent Violet 23: 8%
Polyamic acid (4-APS/BTDA): 15%
NMP: 35%
Cyclohexanone: 34%

EXAMPLE 23: Cyan

Solvent Blue 38: 12%
Polyamic acid (4-APS/BTDA): 16%
NMP: 36%
Cyclohexanone: 36%

EXAMPLE 24: Cyan

Solvent Blue 44: 12%
Polyamic acid (4-APS/BTDA): 16%
NMP: 36%
2-methoxyethyl ether: 36%

EXAMPLE 25: Cyan

Solvent Blue 25: 6%
Solvent Blue 67: 6%

Polyamic acid (PMDA/ODA): 16%
NMP: 36%
Cyclohexanone: 36%

EXAMPLE 26: Cyan

Solvent Blue 70: 6%
Solvent Blue 48: 6%
Polyamic acid (PMDA/ODA): 16%
NMP: 36%
Cyclohexanone: 36%

EXAMPLE 27:

The procedure of Examples 1–3 may also be used to prepare flat panel displays for video monitors and the like using a glass substrate coated with indium-tin-oxide (ITO). The flat panel displays may be of "hybrid" design or the filters may be monolithically integrated. Liquid crystal displays work by the application of an electric field across a liquid crystal cell. The electric field changes the optical properties and the visible appearance of the liquid crystal in the cell. The cell is usually prepared by coating a continuous sheet of transparent conducting material such as indium-tin-oxide on one side of the cell and then placing patterned electrodes which can be individually addressed on the other side of the cell. Color filters are placed in the cell either by "hybrid" techniques or by monolithically integrating the filters into the cell. Applicants' filters may be used in liquid crystal displays in either manner. In addition, applicants' color filters may be patterned either on the continuous or on the patterned electrodes. In conventional liquid crystal displays a thin layer of an aligning material, such as an undyed polyimide, is applied to the display. The aligning layer is rubbed with felt and then placed in contact with the liquid crystal. The mechanical abrasion of the aligning layer provides sites which orient the liquid crystal in a specific manner with respect to the electrode plane. Using applicants' color filters the aligning layer may be eliminated, since the polyimide vehicle of applicants' color filters may be rubbed and used to orient the liquid crystal without an additional aligning layer.

FIG. 6 shows a monolithically integrated flat panel display 300 formed between two glass plates 302 and 304. The uppermost plate 302 has placed thereon a conductive coating of indium-tin-oxide 306 to form an electrode. The lower most glass plate 304 has individually addressable patterned electrodes 308, 310, 312 and 314 placed thereon. Each electrode 308, 310, 312 and 314 has a color filter 316, 318, 320 and 322 patterned thereon as shown. The filters 316, 318, 320 and 322 are deposited and patterned on the electrodes as described previously herein. The filters 316, 318, 320 and 322, after being deposited and patterned, may be abraded with a felt wheel, as is known in the art, to orient the polyimide of the filters and provide sites for aligning the liquid crystal material. The glass plates 302 and 304 are then joined in a sandwich construction, as is conventional in the art, a conventional liquid crystal material 326 is injected into the void between plates 302 and 304 and the structure is sealed to make a flat panel display. The connections for the electrodes and the surrounding structure in which the flat panel is displayed or mounted may be conventional.

FIG. 7 shows an alternatve structure for a flat panel display. In FIG. 7 the flat panel display 400 is formed between glass panels 402 and 404. Glass panels 402 has placed thereon a series of individually addressable electrodes 406, 408, 410 and 412. Glass panel 404 has placed thereon a series of filters 414, 416, 418 and 420 which are placed in register with electrodes 406, 408, 410 and 412, as shown. Filters 414, 416, 418 and 420 are deposited and patterned on a glass plate 404 as described previously herein. A planarizing and protective layer 422 may be deposited on filters 414, 416, 418 and 420 as shown and an electrode layer 424, for example indium-tin-oxide, may be deposited on the protective layer. An aligning layer 426 may then be deposited on top of the electrode and buffed with a felt wheel, as is conventional, to provide aligning sites for the liquid crystal material. Glass panels 402 and 404 may then be joined in a sandwich, as is conventional, to prepare a flat panel display. Liquid crystal material 428 may then be injected into the void between the two panels. It will be appreciated that the electrical connection structure and supporting structure for the flat panel display may be conventional.

FIG. 8 shows a flat panel display 500 prepared using applicants' filters and hybrid techniques. Flat panel display 500 is a sandwich construction using glass plates 502, 504 and 506. A series of color filters 508, 510, 512 and 514 are patterned on plate 506 as previously described herein. A series of electrodes 516, 518, 520 and 524 are prepared on glass plate 504 as shown. A transparent electrode 526 is deposited on plate 502, using indium-tin-oxide for example, as shown. An aligning layer may be included over electrodes 516, 518, 520 and 524, if desired, but for clarity the aligning layer is not shown. Glass plate 506, with filters 508, 510, 512 and 514, is then bonded to plate 504, as shown, with the filters in register with electrodes 516, 518, 520 and 524. All three glass plates 502, 504 and 506 are then joined in a sandwich construction, as is known in the art, and the void between plates 502 and 506 is filled with a liquid crystal 528, as is conventional. It will be appreciated that the electrical contact structure for the electrodes and the supporting structure for the flat panel display are also conventional.

While the above examples have been shown as using a separate vehicle and soluble dye, it will be appreciated that the dye may be a part of the vehicle polymer, e.g. attached to the polymer as an addition compound. The polymer may also be one which has the desired filtering properties, transmitting light of a desired wavelength.

It will be appreciated by those skilled in the art that variations in the invention disclosed herein may be made without departing from the spirit of the invention disclosed. The invention is not to be limited by the specific embodiments disclosed herein but only by the scope of the claims appended hereto.

We claim:

1. In a process of making microelectronic color filter elements by microphotolithography, the improvement comprising, applying a layer of a substantially non-particulate filter coating material to a filter substrate, the filter coating material including a vehicle and a soluble dye incorporation therein, the soluble dye being heat stable and in combination with the vehicle being effective to produce a high color resolution, applying a photoresist to the layer of the filter coating material on the filter substrate, photographically imaging and developing the photoresist, the filter coating material imaging and developing with the photoresist, curing the color element to substantially insolubilize the color element, the cured filter element containing the stable dye being effective to consistently transmit and resolve colored light, the cured filter element containing the stable dye having a high electrical resistivity and a high dielectric strength.

2. The method of claim 1 wherein the substrate is coated with a substantially planar array of filter elements, the filter elements being of a plurality of colors.

3. The method of claim 1 wherein the vehicle is selected from the group consisting of readily soluble polyamic acid precursors of polyimide resins, polymers and copolymers of polyimide resins, and combinations thereof with water soluble resins.

4. The method of claim 1 wherein the vehicle is selected from the group consisting of polyamic acid precursors of polyimide resins.

5. The method of claim 4 wherein the vehicle is selected from the group consisting of ODA and PMDA or ODA, PMDA and BTDA, the vehicle components being present in approximate stoichiometric amounts.

6. The method of claim 4 wherein the vehicle includes PMMA, 4-APS, 3-APS or BAPS.

7. The process of claim 1 including orienting the filter coating material in the color filter element to provide alignment for liquid crystal material.

8. The method of claim 7 including applying a liquid crystal material to the oriented filter coating material.

9. In a process of making microelectronic color filter elements by microphotolithography, the improvement comprising, applying a first layer of a substantially non-particulate filter coating material to a filter substrate, the filter coating material including a vehicle and a first soluble dye incorporated therein, the soluble dye being heat stable and in combination with the vehicle being effective to produce a high color resolution, applying a first photoresist to the layer of filter coating material on the filter substrate and imaging and developing the photoresist, the filter coating material imaging and developing with the photoresist and developing discrete first color elements on the substrate, curing the first color elements to substantially insolubilize the first color elements, applying a second layer of a substantially non-particulate filter coating material to the coating substrate, the second layer of filter coating material including a vehicle and a second soluble dye incorporated therein, the second soluble dye being heat stable and in combination with the vehicle being effective to produce a high color resolution, applying a second photoresist to the layer of filter coating material on the filter substrate and imaging and developing the photoresist, the filter coating material imaging and developing with the photoresist and developing discrete second color elements on the substrate, curing the second color elements to substantially insolubilize the second color elements, the second color elements forming a substantially planar array with the first color elements, the cured filter elements containing the stable dye being effective to consistently transmit and resolve colored light, the cured filter coating material having a high electrical resistivity and a high dielectric strength.

10. The process of claim 9 including orienting the filter coating material in the color filter elements to provide alignment for liquid crystal material.

11. The process of claim 10 including applying a liquid crystal material to the oriented filter coating material.

12. In a process of making microelectronic color filter elements by microphotolithography, the improvement comprising, applying a first layer of a substantially non-particulate filter coating material to a filter substrate, the filter coating material including a vehicle selected from the group consisting of readily soluble polyamic acid precursors of polyimide resins, polymers and copolymers of polyimide resins, and combinations thereof with water soluble resins, the vehicle having a first soluble dye incorporated therein, the soluble dye being heat stable and in combination with the vehicle being effective to produce a high color resolution, applying a first photoresist to the layer of filter coating material on the filter substrate and imaging and developing the photoresist, the filter coating material imaging and developing with the photoresist and developing discrete first color elements on the substrate, curing the first color elements to substantially insolubilize the first color elements, applying a second layer of a substantially non-particulate filter coating material to the filter substrate, the filter coating material including a vehicle selected from the group consisting of readily soluble polyamic acid precursors of polyimide resins, polymers and copolymers of polyimide resins, and combinations thereof with water soluble resins, the vehicle having a second soluble dye incorporated therein, the second soluble dye being heat stable and in combination with the vehicle being effective to produce a high color resolution, applying a second photoresist to the layer of filter coating material on the filter substrate and imaging and developing the photoresist, the filter coating material imaging and developing with the photoresist and developing discrete second color elements on the substrate, curing the second color elements to substantially insolubilize the second color elements, the second color elements being immediately adjacent to the first color elements and forming a substantially planar array with the first color elements, the array of cured filter elements containing the stable dye being effective to consistently transmit and resolve colored light, the cured filter material having a high electrical resistivity and a high dielectric strength.

13. The process of claim 12 including orienting the filter coating material in the filter coating elements to provide alignment for liquid crystal material.

14. The process of claim 13 including applying a liquid crystal material to the oriented filter coating material.

15. In a process of making microelectronic color filter elements by microphotolithography, the improvement comprising, applying a first layer of a substantially non-particulate filter coating material to a filter substrate, the filter coating material including a vehicle selected from the group consisting of polymers and copolymers of ODA and PMDA or ODA, PMDA and BTDA, the vehicle components being present in approximate stoichiometric amounts, and combinations thereof with water soluble resins, the vehicle having a first soluble dye incorporated therein, the soluble dye being heat stable above about 200° C., and in combination with the vehicle, the dye being effective to produce a high color resolution, applying a photoresist to the layer of filter coating material on the filter substrate, photographically imaging and developing the photoresist, the filter coating material imaging and developing with the photoresist to form discrete first color elements on the substrate, curing the first color elements to substantially insolubilize the first color elements, applying a second layer of a substantially non-particulate filter coating material to the filter substrate, the filter coating material including a vehicle selected from the group consisting of polymers and copolymers of ODA and PMDA or ODA, PMDA and BTDA, the vehicle components being present in approximate stoichiometric amounts, and combinations thereof with water soluble resins, the vehicle having a second soluble dye incorporated therein, the second soluble dye being heat stable above about 200° C., and in combination with the vehicle, the dye being effective to produce a high color resolution, applying a photoresist to the layer of filter coating material on the filter substrate, photographically imaging and developing the photoresist, the filter coating material imaging and developing with the photoresist to form discrete second color elements on the substrate, curing the second color elements to substantially insolubilize the second color elements, the second color elements being immediately adjacent to the first color elements and forming a substantially planar array with the first color elements, the array of cured filter elements containing the stable dye being effective to consistently transmit and resolve colored light, at least one set of the color elements having a vehicle containing a modifying polymer selected from the group consisting of 4-APS, 3-APS or BAPS, the cured filter material having an electrical resistivity of above about $3 \times 10^{15}$ ohm-cm and a dielectric strength of above about $7 \times 10^5$ volts/cm, abrading the array of cured filter elements to orient the filter coating material and provide alignment for liquid crystal material and applying a liquid crystal material to the oriented filter coating material.

* * * * *